(12) United States Patent
Tan et al.

(10) Patent No.: US 12,381,590 B2
(45) Date of Patent: Aug. 5, 2025

(54) RECEIVER AND ZERO-INTERMEDIATE FREQUENCY TRANSCEIVER

(71) Applicant: Hangzhou Geo-Chip Technology Co., Ltd., Hangzhou (CN)

(72) Inventors: Chun Geik Tan, San Diego, CA (US); Ruili Wu, Hangzhou (CN)

(73) Assignee: Hangzhou Geo-Chip Technology Co., LTD, Hangzhou (CN)

( * ) Notice: Subject to any disclaimer, the term of this patent is extended or adjusted under 35 U.S.C. 154(b) by 0 days.

(21) Appl. No.: 18/600,570

(22) Filed: Mar. 8, 2024

(65) Prior Publication Data

US 2024/0305326 A1    Sep. 12, 2024

(51) Int. Cl.
*H04B 1/16* (2006.01)
*H03D 7/14* (2006.01)

(52) U.S. Cl.
CPC ............. *H04B 1/16* (2013.01); *H03D 7/1441* (2013.01); *H03D 7/1458* (2013.01)

(58) Field of Classification Search
None
See application file for complete search history.

(56) References Cited

U.S. PATENT DOCUMENTS 11,251,751 B1 *  2/2022  Tan ..................... H03D 7/165

FOREIGN PATENT DOCUMENTS

| CN | 104779917 |   | 7/2015  |   |          |
|----|-----------|---|---------|---|----------|
| CN | 110557130 |   | 12/2019 |   |          |
| CN | 110557130 A | * | 12/2019 | ............... | H04B 1/10 |
| CN | 111384902 |   | 7/2020  |   |          |
| CN | 111384902 A | * | 7/2020  | ............... | H03F 1/26 |
| CN | 114124123 |   | 3/2022  |   |          |
| CN | 114389629 |   | 4/2022  |   |          |

OTHER PUBLICATIONS

Notification of the First Office Action for Chinese Application No. 202310215337.3, issue Date Feb. 27, 2024, pp. 1-18.
Notice of Granting Invention for Chinese Application No. 202310215337.3, Issue Date Apr. 4, 2024, pp. 1-6.

\* cited by examiner

*Primary Examiner* — Jinsong Hu
*Assistant Examiner* — Alexander J Yi
(74) *Attorney, Agent, or Firm* — Robert C. Kowert; Kowert, Hood, Munyon, Rankin & Goetzel, P.C.

(57) ABSTRACT

Disclosed are a receiver and a zero-IF transceiver. The receiver includes a frequency mixer circuit including two mixers in parallel and weighted feedback circuits respectively corresponding to the mixers, each mixer having an output end connected to an input end of the corresponding weighted feedback circuit, and each weighted feedback circuit having an output end connected to an input end of the other weighted feedback circuit. Each mixer is configured to receive a baseband signal, mix the baseband signal, and input the resulting mixed signal to the corresponding weighted feedback circuit; and each weighted feedback circuit is configured to receive the mixed signal from the corresponding mixer, and adjust the received mixed signal using complex impedance-based feedback to compensate for an asymmetric frequency response in a wideband zero-IF receiver. Weighted feedback circuits are utilized for adjustments using complex impedance-based feedbacks, thereby alleviating quadrature imbalance and reducing power consumption and cost.

8 Claims, 4 Drawing Sheets

RECEIVER AND ZERO-INTERMEDIATE FREQUENCY TRANSCEIVER

CROSS REFERENCES TO RELATED APPLICATIONS

This application claims priority to Chinese Patent Application No. 202310215337.3, filed on Mar. 8, 2023 and entitled "RECEIVER AND ZERO-INTERMEDIATE FREQUENCY TRANSCEIVER", which is incorporated by reference herein in its entirety.

TECHNICAL FIELD

The present disclosure relates to the field of communications, and in particular, to a receiver and a zero-intermediate frequency (IF) transceiver.

BACKGROUND

In recent years, zero-IF technology has been widely used in wireless receivers. The zero-IF technology is a modulation and demodulation method in which a signal may be converted directly from Radio Frequency (RF) to baseband without conversion to IF. Although zero-IF receivers which have a zero-IF architecture are simple in circuit structure, easy to integrate, and low in cost and power consumption, the zero-IF architecture has the problem that the gain imbalance present between the positive and negative frequency offsets in a relatively wide signal bandwidth may cause significant performance degradation of the zero-IF receivers.

In order to reduce such a fluctuation present between positive and negative frequency offsets, circuit optimization is conventionally adopted for example by adding a complex compensation device, which however involves a relatively high power consumption and cost.

SUMMARY

Embodiments of the present disclosure provide at least a receiver and a zero-IF transceiver that compensates for an asymmetric frequency response in a wideband zero-IF receiver.

In a first aspect, embodiments of the present disclosure provide a receiver, including a frequency mixer circuit that includes two mixers in parallel and weighted feedback circuits respectively corresponding to the mixers. Each mixer has an output end connected to an input end of a corresponding weighted feedback circuit, and any one of the weighted feedback circuits has an output end connected to an input end of the other one of the weighted feedback circuits. Each mixer is configured to receive a baseband signal, perform frequency mixing on the baseband signal, and input the resulting mixed signal to a weighted feedback circuit electrically connected to said each mixer, and each weighted feedback circuit is configured to receive the mixed signal output by a corresponding mixer, and perform adjustment on the received mixed signal using a complex impedance-based feedback to compensate for an asymmetric frequency response in a wideband zero-IF receiver.

In a possible embodiment, each weighted feedback circuit includes a trans-impedance amplifier, and at least one weighted feedback resistor connected between an output end of the trans-impedance amplifier and the input end of the other weighted feedback circuit.

In a possible embodiment, a first weighted feedback resistor is connected between a first output end of the trans-impedance amplifier and a first input end of the other weighted feedback circuit; and a second weighted feedback resistor is connected between a second output end of the trans-impedance amplifier and a second input end of the other weighted feedback circuit.

In a possible implementation, each weighted feedback resistor has a complex impedance that causes the frequency mixer circuit to have properties of phase conversion and gain adjustment.

In a possible embodiment, the two mixer includes a first mixer and a second mixer, where the first mixer is connected to a first weighted feedback circuit, and the second mixer is connected to a second weighted feedback circuit, the first weighted feedback circuit having two input ends respectively connected to two output ends of the second weighted feedback circuit, and the second weighted feedback circuit having two input ends connected to two output ends of the first weighted feedback circuit.

In a possible embodiment, the first mixer is an I-path mixer and the second mixer is a Q-path mixer, where the I-path mixer is configured to perform frequency mixing on the baseband signal based on a local oscillator (LO) frequency signal to obtain an I-path signal, and the Q-path mixer is configured to perform frequency mixing on the baseband signal based on a signal with a phase offset of 90° from the LO frequency signal to obtain a Q-path signal.

In a possible embodiment, the first weighted feedback circuit includes a first trans-impedance amplifier having a first input end connected to a second output end of the second weighted feedback circuit, a second input end connected to a first output end of the second weighted feedback circuit, a first output end connected to a first input end of the second weighted feedback circuit, and a second output end connected to a second input end of the second weighted feedback circuit.

In a possible embodiment, the second weighted feedback circuit includes a second trans-impedance amplifier having a first input end connected to a first output end of the first weighted feedback circuit, a second input end connected to a second output end of the first weighted feedback circuit, a first output end connected to a second input end of the first weighted feedback circuit, and a second output end connected to a first input end of the first weighted feedback circuit.

In a second aspect, the present disclosure also provides a zero-IF transceiver including the receiver according to any of the first aspect and its various embodiments.

A receiver and a zero-IF transceiver are used, where the receiver includes two mixers in parallel and weighted feedback circuits respectively corresponding to the mixers, each of the mixers having an output end connected to an input end of the corresponding weighted feedback circuit, and any one of the weighted feedback circuits having an output end connected to an input end of the other one of the weighted feedback circuits, each mixer is configured to receive a baseband signal, perform frequency mixing on the baseband signal, and input the resulting mixed signal to the weighted feedback circuit electrically connected to said each mixer, and each weighted feedback circuit is configured to receive the mixed signal output by the corresponding mixer, and perform adjustment on the received mixed signal using a complex impedance-based feedback to compensate for an asymmetric frequency response in a wideband zero-IF receiver. It can be seen that the present disclosure utilizes the weighted feedback circuits to introduce adjustments using complex impedance-based feedbacks, thus could alleviate the problem of quadrature imbalance as much as possible, and could avoid a circuit design that adds complex compensation device, thereby saving power consumption and cost resulting therefrom.

Other advantages of the present disclosure will be explained in more detail in conjunction with the following description and accompanying drawings.

It should be understood that the above description is a summary of the technical solutions of the present disclosure only for the purpose of facilitating a better understanding of the technical means of the present disclosure so that the disclosure can be implemented according to the description in the specification. Specific embodiments of the present disclosure are given below to render the above and other objects, features and advantages of the present disclosure more clear.

BRIEF DESCRIPTION OF DRAWINGS

In order to illustrate the technical solutions of the embodiments of the present disclosure more clearly, the accompanying drawings required in the embodiments will be briefly introduced below, which are incorporated in and constitute a part of the specification, and which shows the embodiments in consistent with the present disclosure and, together with the description, serve to explain the embodiments of the present disclosure. It should be understood that the following drawings depict only certain embodiments of the present disclosure and therefore should not be considered as limiting the scope, and a person of ordinary skill in the art to which the present disclosure pertains could also derive other relevant drawings from these drawings without creative efforts. In addition, the same reference numerals are designated for the same components throughout the drawings. In the drawings.

DETAILED DESCRIPTION

Figure 1:
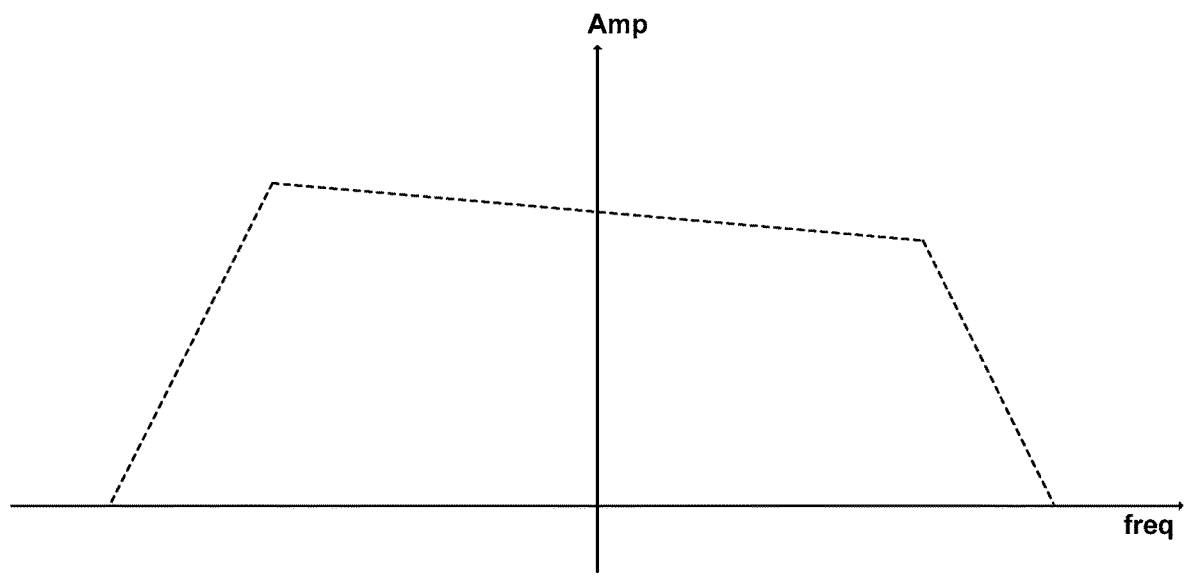
FIG. 1 is a schematic diagram showing a frequency response imbalance in the related art.

Exemplary embodiments of the present disclosure will be described in more detail below with reference to the accompanying drawings. Although exemplary embodiments of the present disclosure are shown in the drawings, it should be understood that the present disclosure may be implemented in various ways and should not be construed to be limited to the embodiments set forth herein. Rather, these embodiments are provided to facilitate more thorough understanding of the present disclosure, so that the scope of the disclosure could be fully conveyed to a person of ordinary skill in the art.

In description of embodiments of the present disclosure, it should be understood that terms such as "include" or "have" are intended to indicate the existence of the characteristics, digits, steps, actions, components, parts disclosed in the specification or any combination thereof, without excluding the existence of one or more other characteristics, digits, steps, actions, components, parts or any combination thereof.

"/" refers to "or", unless otherwise specified. For example, A/B may indicate A or B. As used herein, the term "and/or" merely describes an association relationship between the associated objects, indicating that there may be three relationships. For example, A and/or B may indicate three cases where only A exists, both A and B exist, and only B exist.

The terms such as "first" and "second" are for descriptive purposes only and are not intended to be construed as indicating or implying a relative importance or implicitly indicating the number of technical features indicated. Hence, features defined by "first" or "second" may explicitly or implicitly include one or more features. In the description of the embodiments of the present disclosure, "a plurality of" means two or more in number, unless otherwise specified.

Research has found that the zero-IF architecture has the problem that the gain imbalance present between the positive and negative frequency offsets in the relatively wide signal bandwidth may cause significant performance degradation. In order to reduce such a fluctuation present between positive and negative frequency offsets, circuit optimization is conventionally adopted for example by adding a complex compensation device, which however involves a relatively high power consumption and cost.

To at least partially address one or more of the above problems and other potential problems, the present disclosure provides at least a receiver and a zero-IF transceiver for compensating for the asymmetric frequency response in a wideband zero-IF receiver as much as possible.

In a zero-IF receiver, the small-signal AC frequency response is relatively flat over the required bandwidth (BW) if it is not too wide (typically BW is less than 20 MHz). If the required bandwidth is wider (BW>40 MHz), the receiver is prone to an asymmetric frequency response, as shown in FIG. 1 in which the horizontal axis freq represents the frequency and the vertical axis Amp represents the response.

Here, the frequency response characteristics mainly refers to, when sinusoidal signals with different frequencies are input into the system, a relationship between the amplitudes and phases of the corresponding output signals and the frequencies. The frequency response characteristics can be represented by a frequency response function, which is composed of amplitude-frequency characteristics (decibel) and phase-frequency characteristics (radian). It can be seen that under ideal circumstances the frequency response characteristics are flat and positive and negative symmetrical, i.e., the fidelity of the frequency response is supposed to meet requirements, but due to the positive and negative imbalance of the high frequency signal, an offset occurs, as shown in FIG. 1, which will eventually lead to excessive noise in the output signal of the mixer in the receiver.

To solve the above problems, embodiments of the present disclosure provide a receiver and a zero-IF transceiver applicable to a zero-IF architecture, which could compensate for the asymmetric frequency response of the receiver in a wideband zero-IF architecture by adjusting the complex impedance by adding a weighted feedback resistor to the Trans-Impedance Amplifier (TIA).

The receiver and the zero-IF transceiver will be described in details below.

Figure 2:
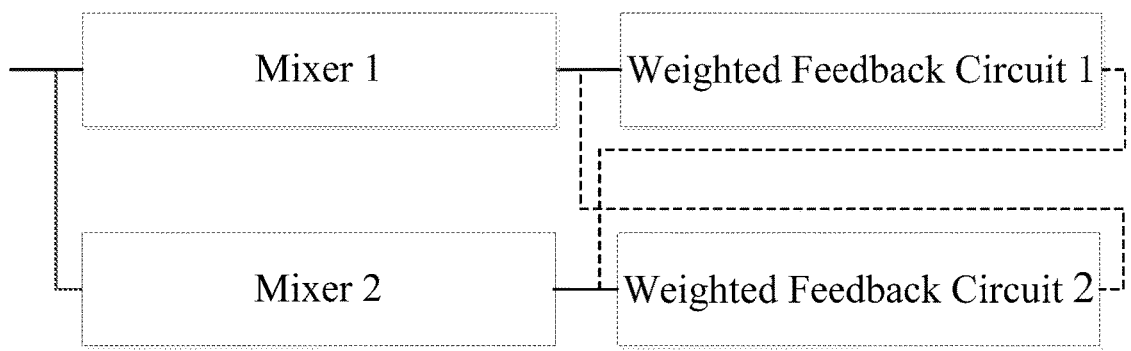
FIG. 2 is a schematic diagram of a receiver according to an embodiment of the present disclosure.

FIG. 2 illustrates a schematic structural diagram of a receiver according to an embodiment of the present disclosure. It should be noted that the receiver disclosed in the present disclosure is part of a zero-IF transceiver, with the mixer as an important component therein. The receiver at least includes two mixers in parallel (i.e., a mixer 1 and a mixer 2), and weighted feedback circuits (i.e., a weighted feedback circuit 1 and a weighted feedback circuit 2) respectively corresponding to the mixers in a frequency mixer circuit. Each mixer has an output end connected to the input end of the corresponding weighted feedback circuit. As shown in the figure, the mixer 1 is electrically connected to the weighted feedback circuit 1, and the mixer 2 is electrically connected to the weighted feedback circuit 2. In addition, any one of the weighted feedback circuits has an output end connected to the input end of the other one of the weighted feedback circuits. As shown in the figure, the output end of the weighted feedback circuit 1 is connected to the output end of the mixer 2 (corresponding to the input end of the weighted feedback circuit 2) with a dotted line, and the output end of the weighted feedback circuit 2 is connected to the output end of the mixer 1 (corresponding to the input end of the weighted feedback circuit 1) with a dotted line.

Each mixer is configured to receive a baseband signal, perform frequency mixing on the baseband signal, and input the resulting mixed signal to a weighted feedback circuit electrically connected to said each mixer; and each weighted feedback circuit is configured to receive the mixed signal output by the corresponding mixer, and perform adjustment on the received mixed signal using a complex impedance-based feedback to compensate for an asymmetric frequency response in a wideband zero-IF receiver.

Figure 3:
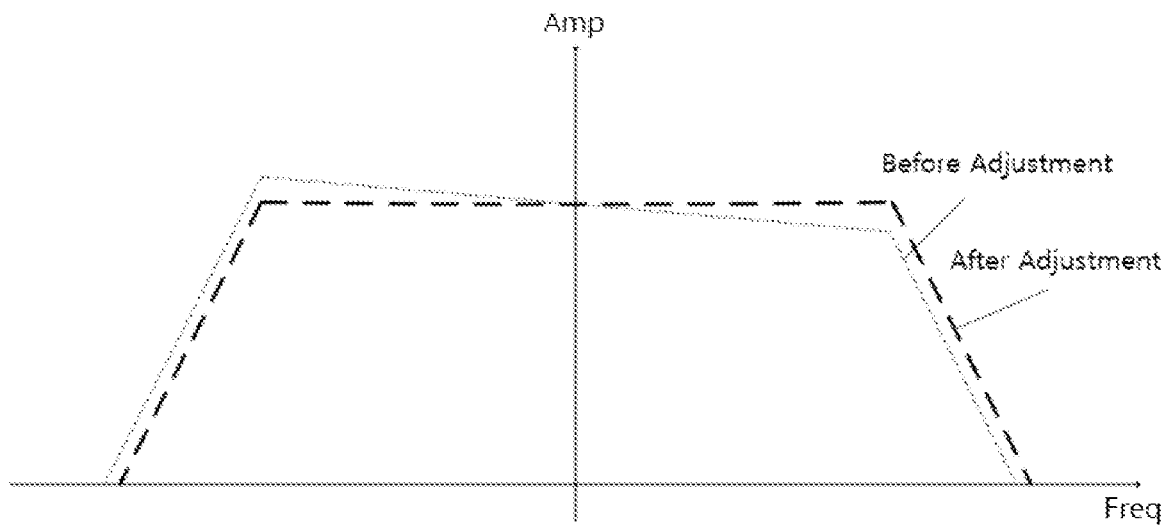
FIG. 3 is a schematic diagram showing comparison between frequency responses before and after positive and negative imbalance adjustment achieved by a receiver according to an embodiment of the present disclosure.

Here, one weighted feedback circuit is connected to each of the two mixers in parallel, and each weighted feedback circuit does not provide feedback to the corresponding mixer, but is connected to the other mixer via a weighted feedback. Assuming that the same signal is simultaneously applied to two inputs with a 900 phase shift between the input channels, the trans-impedance feedback mode of the weighted feedback circuit can eliminate the phase and amplitude inconsistency on the signal path to a greater extent, and thus can compensate for the asymmetric frequency response in the wideband zero-IF receiver, thereby improving the performance of the zero-IF architecture to an optimal level. FIG. 3 illustrates the schematic diagram of the frequency response characteristics before and after the adjustment.

Figure 4:
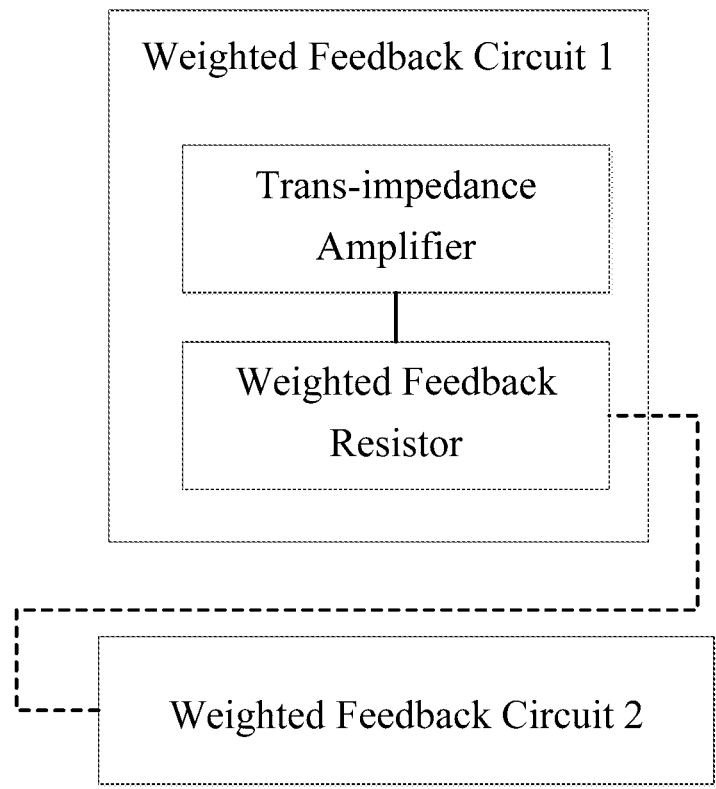
FIG. 4 is a schematic structural diagram of a weighted feedback circuit in a receiver according to an embodiment of the present disclosure.

The mixer typically consists of a non-linear element and a frequency selection loop to output a signal at a new frequency equal to the sum, difference or other combination of the frequencies of input signals, so that other characteristics of the original signal are better preserved. The weighted feedback circuit is mainly configured to perform adjustment using a complex impedance-based feedback. In an embodiment of the present disclosure, the weighted feedback circuit may include a trans-impedance amplifier and at least one weighted feedback resistor, where the trans-impedance amplifier of one weighted feedback circuit may be connected to the input end of the other weighted feedback circuit in a feedback manner. Referring to FIG. 4 illustrating a basic structure of the weighted feedback circuit, the weighted feedback resistor of the weighted feedback circuit 1 may be connected to the input end of the weighted feedback circuit 2 in a feedback manner, and similarly the weighted feedback resistance of the weighted feedback circuit 2 may also be connected to an input end (not shown) of the weighted feedback circuit 1 in a feedback manner, thus achieving a good feedback mechanism.

Figure 5:
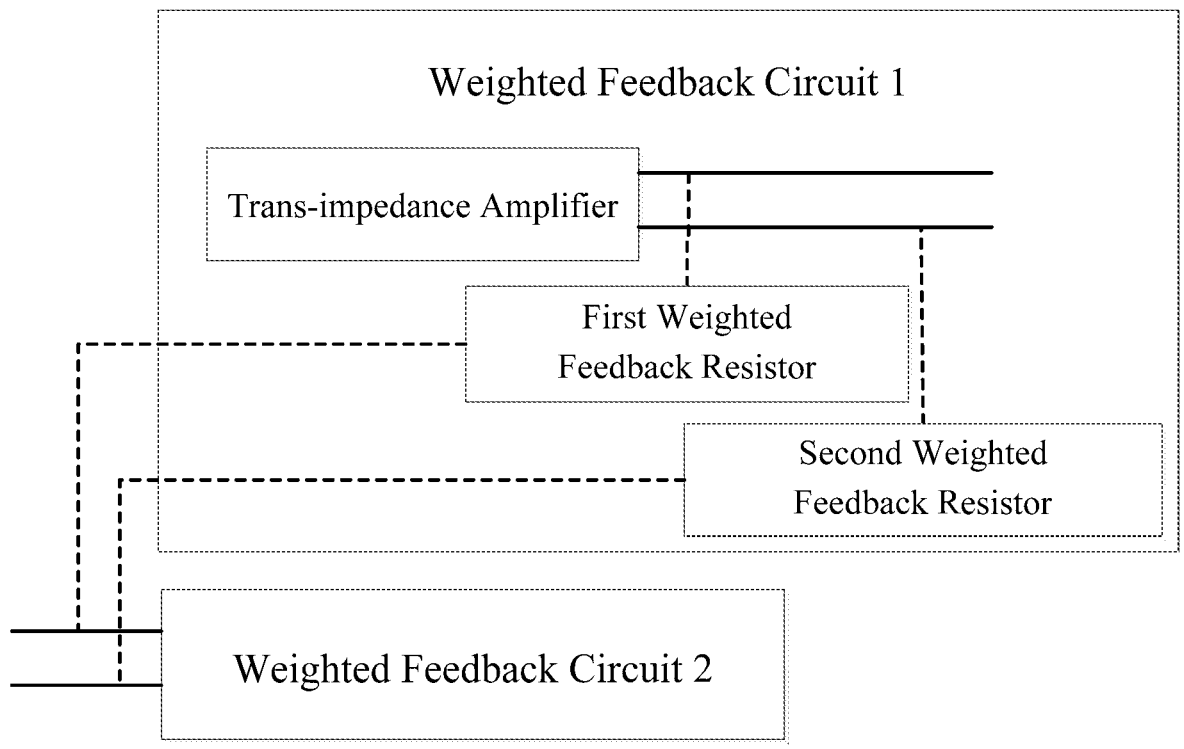
FIG. 5 is a schematic structural diagram of a weighted feedback circuit in a receiver according to another embodiment of the present disclosure.

In practice, the trans-impedance amplifier herein may include two input ends, and the weighted feedback circuit may also include two input ends, and in order to better achieve the feedback effect, the trans-impedance amplifier can realize feedback via a connected weighted feedback resistor. Here, a first weighted feedback resistor can be connected between a first output end of one trans-impedance amplifier and a first input end of the other weighted feedback circuit, and a second weighted feedback resistor can be connected between a second output end of the one trans-impedance amplifier and a second input end of the other weighted feedback circuit. Referring to FIG. 5 that illustrates an implementation of the circuit feedback mechanism, the trans-impedance amplifier of the weighted feedback circuit 1 may provide feedback to the weighted feedback circuit 2 via two weighted feedback resistors, and similarly the trans-impedance amplifier of the weighted feedback circuit 2 may provide feedback to the weighted feedback circuit 1 via two weighted feedback resistors (not shown).

In addition to the weighted feedback resistor, the weighted feedback circuit according to the embodiments of the present disclosure is further provided with a basic resistor, which is connected between the input end and the output end of the trans-impedance amplifier for adjusting the current flowing through the trans-impedance amplifier. For example, the greater the resistance value of the basic resistor, the smaller the divided current; to the contrary, the smaller the resistance value of the basic resistor, the greater the divided current. The resistance value of the basic resistor can be set by specific requirements herein.

Figure 6:
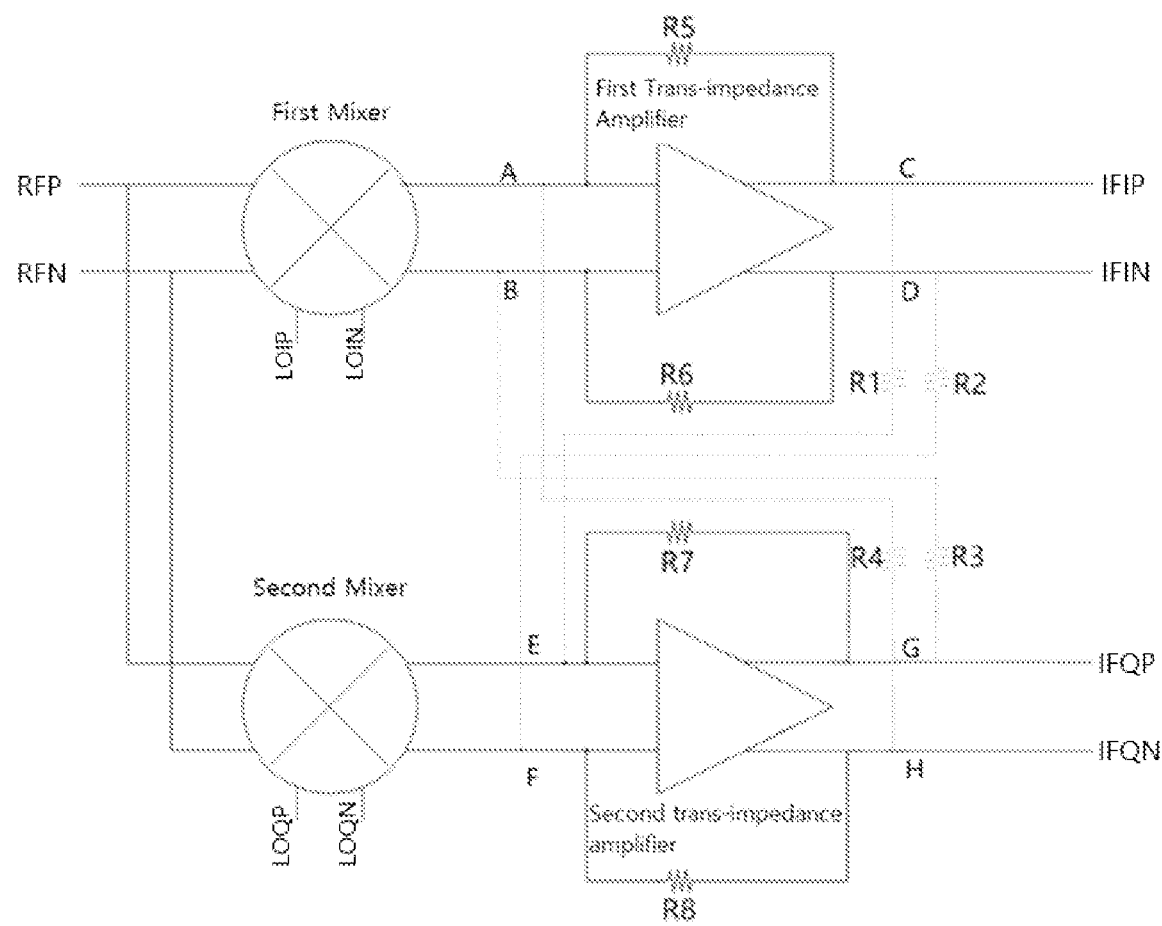
FIG. 6 is a schematic diagram showing application of a receiver according to an embodiment of the present disclosure.

In an embodiment of the present disclosure, the two mixers includes a first mixer and a second mixer. As shown in FIG. 6, the first mixer is correspondingly connected to a first weighted feedback circuit, and the second mixer is correspondingly connected to a second weighted feedback circuit, where two input ends of the first weighted feedback circuit are respectively connected to two output ends of the second weighted feedback circuit, and the two input ends of the second weighted feedback circuit are respectively connected to the two output ends of the first weighted feedback circuit.

To facilitate a further understanding of the feedback mechanism provided by embodiments of the present disclosure, further description is provided herein in conjunction with FIG. 6.

As shown in FIG. 6, the first weighted feedback circuit includes a first trans-impedance amplifier, and two weighted feedback resistors R1 and R2 which are connected to the output ends of the first trans-impedance amplifier and are connected to the input ends of the second weighted feedback circuit in a feedback manner; in addition, the second weighted feedback circuit includes a second trans-impedance amplifier, and two weighted feedback resistors R3 and R4 which are connected to the output ends of the second trans-impedance amplifier and are connected to the input ends of the first weighted feedback circuit in a feedback manner; and the positive and negative imbalance problem can be alleviated to a greater extent by the dynamic adjustment of the four weighted feedback resistors R1, R2, R3 and R4.

At the same time, two basic resistors R5 and R6 are connected to the input ends and the output ends of the first trans-impedance amplifier, and two basic resistors R7 and R8 are connected to the input ends and the output ends of the second trans-impedance amplifier to adjust the current flowing through the corresponding amplifier to a greater extent.

As shown in FIG. 6, a first input end A of the first trans-impedance amplifier is connected to a second output end H (i.e., a second output end of the second trans-impedance amplifier) of the second weighted feedback circuit, and a second input end B of the first trans-impedance amplifier is connected to a first output end G (i.e., a first output end of the second trans-impedance amplifier) of the second weighted feedback circuit; and a first output end C of the first trans-impedance amplifier is connected to a first input end E (i.e., a first input end of the second trans-impedance amplifier) of the second weighted feedback circuit, and a second output end D of the first trans-impedance amplifier is connected to a second input end F (i.e., a second input end of the second trans-impedance amplifier) of the second weighted feedback circuit.

In addition, a first input end E of the second trans-impedance amplifier is connected to a first output end C (i.e., a first output end of the first trans-impedance amplifier) of the first weighted feedback circuit, and a second input end F of the second trans-impedance amplifier is connected to a second output end D (i.e., a second output end of the first trans-impedance amplifier) of the first weighted feedback circuit; and a first output end G of the second trans-impedance amplifier is connected to a second input end B (i.e., a second input end of the first trans-impedance amplifier) of the first weighted feedback circuit, and a second output end H of the second trans-impedance amplifier is connected to a first input end A (i.e., a first input end of the first trans-impedance amplifier) of the first weighted feedback circuit.

In practice, the first mixer and the second mixer in the embodiments of the present disclosure may use complex mixers corresponding to an I-path mixer and a Q-path mixer respectively, where the I-path mixer is configured to perform frequency mixing on the baseband signal based on a local oscillator (LO) frequency signal to obtain an I-path signal, and the Q-path mixer is configured to perform frequency mixing on the baseband signal based on a signal with a phase offset of 900 from the LO frequency signal to obtain a Q-path signal.

Similarly, the first trans-impedance amplifier of the first weighted feedback circuit corresponding to the I-path mixer may be connected with two weighted feedback circuits fed back to the Q-path mixer, and the second trans-impedance amplifier of the second weighted feedback circuit corresponding to the Q-path mixer may be connected with two weighted feedback circuits fed back to the I-path mixer, which will not be described in detail herein.

The embodiments described above mainly provide a zero-IF transceiver scheme, and in practice, a set of zero-IF transceiver schemes may be provided with reference to a receiver, and will not be described in detail herein.

In summary, a receiver and a zero-IF transceiver are used, where the receiver includes two mixers in parallel and weighted feedback circuits respectively corresponding to the mixers, each of the mixers having an output end connected to an input end of the corresponding weighted feedback circuit, and any one of the weighted feedback circuits having an output end connected to an input end of the other one of the weighted feedback circuits, each mixer being configured to receive a baseband signal, perform frequency mixing on the baseband signal, and input the resulting mixed signal to a weighted feedback circuit electrically connected to said each mixer, and each weighted feedback circuit being configured to receive a mixed signal output by the corresponding mixer, and perform adjustment on the received mixed signal using a complex impedance-based feedback to compensate for an asymmetric frequency response in a wideband zero-IF receiver. It can be seen that the present disclosure utilizes the weighted feedback circuits to introduce adjustments using complex impedance-based feedbacks, thus could alleviate the problem of quadrature imbalance as much as possible, and could avoid a circuit design that adds complex compensation device, thereby saving power consumption and cost resulting therefrom.

In descriptions of the specification, reference to description of the terms "some possible embodiments", "some embodiments", "examples", "specific examples", or "some examples", etc. means that a particular feature, structure, material, or characteristic described in connection with the embodiment or example is included in at least one embodiment or example of the present disclosure. In the description, schematic representations of the above terms are not necessarily directed to the same embodiment or example. Further, the particular features, structures, materials, or characteristics described may be combined in any one or more embodiments or examples in any suitable manner. Moreover, various embodiments or examples described in the description, as well as features of various embodiments or examples, may be integrated and combined by a person skilled in the art unless they are inconsistent with each other.

While the spirit and principles of the present disclosure have been described with reference to several specific embodiments, it is to be understood that the present disclosure is not limited to the specific embodiments disclosed, and that the division of aspects does not imply that the features in these aspects cannot be combined to advantage, and is merely for convenience in presentation. The present disclosure is intended to cover various modifications and equivalent arrangements included within the spirit and scope of the appended claims.

What is claimed is:

1. A receiver, comprising a frequency mixer circuit that comprises two mixers in parallel and weighted feedback circuits respectively corresponding to the mixers, each of the mixers having an output end connected to an input end of a corresponding one of the weighted feedback circuits, and any one of the weighted feedback circuits having an output end connected to an input end of the other one of the weighted feedback circuits so that said any one of the weighted feedback circuits is connected to one of the mixers that corresponds to the other one of the weighted feedback circuits via a weighted feedback;

wherein each of the mixers is configured to receive a baseband signal, perform frequency mixing on the baseband signal to obtain a mixed signal, and input the mixed signal to one of the weighted feedback circuits electrically connected to said each mixer;

and each of the weighted feedback circuits is configured to receive the mixed signal output by a corresponding one of the mixers, and perform adjustment on the received mixed signal using a complex impedance-based feedback to compensate for an asymmetric frequency response in a wideband zero-intermediate frequency (IF) receiver, wherein the mixers comprise a first mixer and a second mixer, and the weighted feedback circuits comprise a first weighted feedback circuit comprising a first trans-impedance amplifier and first at least one weighted feedback resistor, and a second weighted feedback circuit comprising a second trans-impedance amplifier and second at least one weighted feedback resistor, wherein the first mixer has an output end connected to an input end of the first trans-impedance amplifier and further connected to an output end of the second trans-impedance amplifier via the first at least one weighted feedback resistor, and the second mixer has an output end connected to an input end of the second trans-impedance amplifier and further connected to an output end of the first trans-impedance amplifier via the second at least one weighted feedback resistor.

2. The receiver according to claim 1, wherein the first at least one weighted feedback resistor comprises two weighted feedback resistors respectively connected between two output ends of the first trans-impedance amplifier and two input ends of the second weighted feedback circuit; and the second at least one weighted feedback resistor comprises two weighted feedback resistors respectively connected between two output ends of the second trans-impedance amplifier and two input ends of the first weighted feedback circuit.

3. The receiver according to claim 1, wherein each of the first at least one weighted feedback resistor and the second at least one weighted feedback resistor has a complex impedance so that the frequency mixer circuit has properties of phase conversion and gain adjustment.

4. The receiver according to claim 1, wherein the first weighted feedback circuit having two input ends respectively connected to two output ends of the second weighted feedback circuit, and the second weighted feedback circuit having two input ends respectively connected to two output ends of the first weighted feedback circuit.

5. The receiver according to claim 4, wherein the first mixer is an I-path mixer and the second mixer is a Q-path mixer, the I-path mixer being configured to perform frequency mixing on the baseband signal based on a local oscillator (LO) frequency signal to obtain an I-path signal, and the Q-path mixer being configured to perform frequency mixing on the baseband signal based on a signal with a phase offset of 90° from the LO frequency signal to obtain a Q-path signal.

6. The receiver according to claim 4, wherein the first first trans-impedance amplifier has a first input end connected to a second output end of the second weighted feedback circuit, a second input end connected to a first output end of the second weighted feedback circuit, a first output end connected to a first input end of the second weighted feedback circuit, and a second output end connected to a second input end of the second weighted feedback circuit.

7. The receiver according to claim 4, wherein the second trans-impedance amplifier has a first input end connected to a first output end of the first weighted feedback circuit, a second input end connected to a second output end of the first weighted feedback circuit, a first output end connected to a second input end of the first weighted feedback circuit, and a second output end connected to a first input end of the first weighted feedback circuit.

8. A zero-intermediate frequency (IF) transceiver, comprising the receiver according to claim 1.

* * * * *